United States Patent [19]
Leavitt et al.

[11] Patent Number: 5,875,098
[45] Date of Patent: Feb. 23, 1999

[54] THERMOELECTRIC MODULE WITH GAPLESS EGGCRATE

[75] Inventors: Frederick A. Leavitt, San Diego; John C. Bass; Norbert B. Elsner, both of La Jolla, all of Calif.

[73] Assignee: Hi-Z Corporation, San Diego, Calif.

[21] Appl. No.: 823,233

[22] Filed: Mar. 24, 1997

Related U.S. Application Data

[63] Continuation-in-part of Ser. No. 417,676, Apr. 6, 1995, and a continuation-in-part of Ser. No. 650,299, May 20, 1996.

[51] Int. Cl.$^6$ ........................................................ H05K 7/20
[52] U.S. Cl. ............................. 361/708; 62/3.7; 136/203; 257/930; 361/699
[58] Field of Search ..................................... 361/699, 776, 361/789, 702, 704, 712, 705–708; 136/203–205; 165/80.3, 80.4, 104.33; 62/3.2, 3.3, 3.6, 3.7, 259.2; 257/64, 719, 712–714, 723, 724, 930

[56] References Cited

U.S. PATENT DOCUMENTS

| | | | |
|---|---|---|---|
| 4,497,973 | 2/1985 | Heath | 136/212 |
| 4,611,089 | 9/1986 | Elsner | 136/230 |
| 4,859,250 | 8/1989 | Buist | 136/225 |
| 5,040,381 | 8/1991 | Hazen | 62/3.2 |
| 5,367,890 | 11/1994 | Doke | 62/3.7 |
| 5,436,467 | 7/1995 | Elsner | 257/15 |
| 5,448,109 | 9/1995 | Cauchy | 257/719 |
| 5,550,387 | 8/1996 | Elsner | 257/15 |

*Primary Examiner*—Gerald P. Tolin
*Attorney, Agent, or Firm*—John R. Ross

[57] ABSTRACT

A thermoelectric module having a gapless insulating eggcrate providing insulated spaces for a large number of p-type and n-type thermoelectric elements. The absence of gaps in the walls of the spaces virtually eliminates the possibility of interwall shorts between the elements. Electrical connections on both the hot and cold sides of the module electrically connect the elements in series or in parallel as desired. Usually, most or all of the elements will be connected in series. In a preferred embodiment, the gapless eggcrate is formed from a high temperature plastic. In a preferred embodiment, two lead wires are added before adding the hot and cold side electrical connections. In this embodiment, electrical connections on the hot and cold sides comprise a thin layer of molybdenum and a coating of aluminum over the molybdenum. The surfaces are ground down to expose the insulating eggcrate walls except where connections between the elements are desired. In this preferred embodiment a seal is then applied over both the hot and cold surfaces. The seal preferably is comprised of a very thin electrically insulating layer and over this electrically insulating layer a thin metal layer is provided.

22 Claims, 10 Drawing Sheets

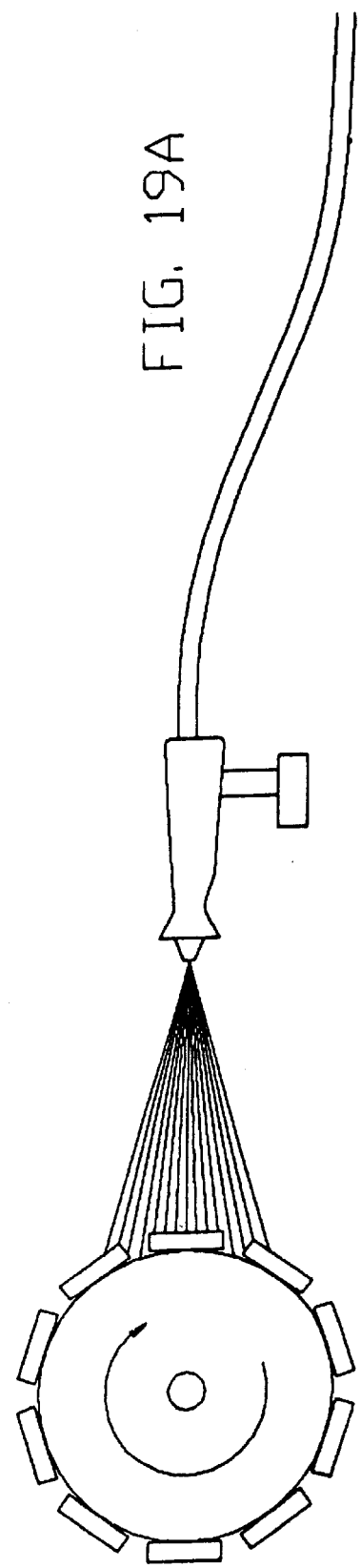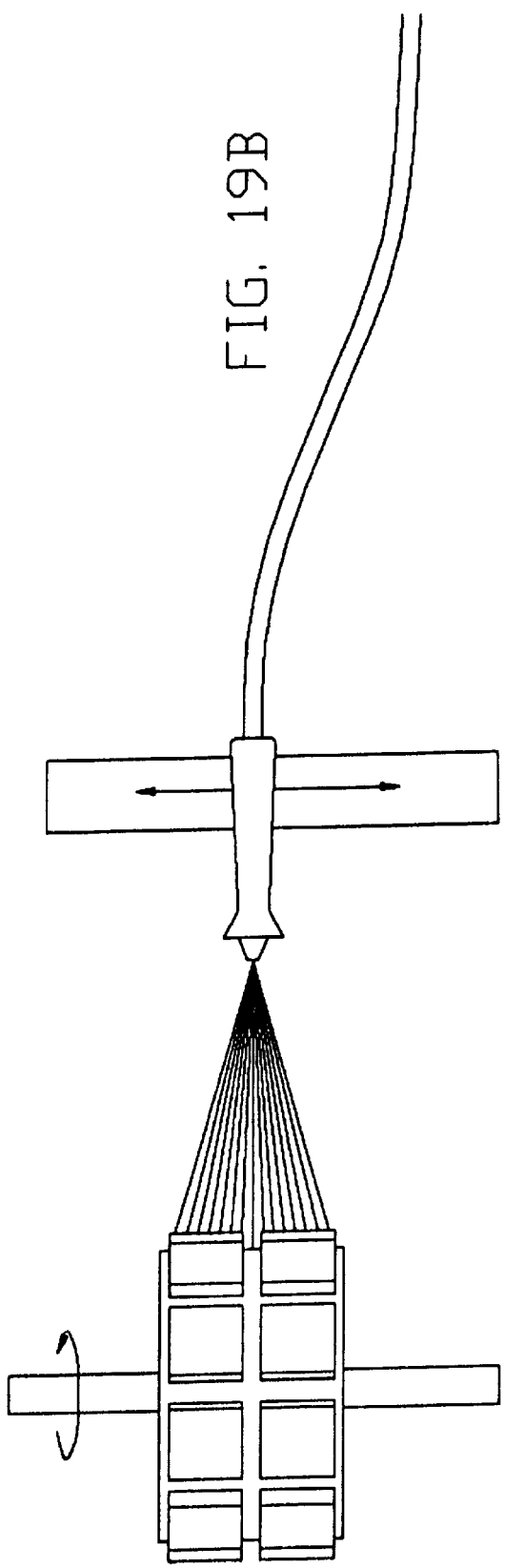
FIG. 19A
FIG. 19B

THERMOELECTRIC MODULE WITH GAPLESS EGGCRATE

This a continuation-in-part application of Ser. No. 08/417,676, filed Apr. 6, 1995 and Ser. No. 08/650,299 filed May 20, 1996. The present invention relates to thermoelectric devices and in particular to modular thermoelectric devices.

BACKGROUND OF THE INVENTION

Thermoelectric devices are well known. These devices utilize physics principals known as the Seebeck effect discovered in 1821 and the Peltier effect discovered in 1834. The Seebeck principle tells us that if two wires of different materials (such as copper and iron) are joined at their ends, forming two junctions, and one junction is held at a higher temperature than the other junction, a voltage difference will arise between the two junctions. The Peltier effect describes an inverse effect. If current is sent through a circuit made of dissimilar materials, heat will be absorbed at one junction and given up or evolved at the other junction.

Most thermoelectric devices currently in use today to generate electricity or for cooling utilize semiconductor materials (such as bismuth telluride) which are good conductors of electricity but poor conductors of heat. These semiconductors are typically heavily doped to create an excess of electrons (n-type) or a deficiency of electrons (p-type). An n-type semiconductor will develop a negative charge on the cold side and a p-type semiconductor will develop a positive charge on the cold side.

Since each element of a semiconductor thermoelectric device will produce only a few millivolts it is generally useful to arrange the elements in series so as to produce higher voltages for the generation of electricity or to permit use of higher voltages for cooling. Several techniques have been developed for arranging the semiconductor elements in series in thermoelectric devices. One such prior art method is shown in FIG. 20. In this device p and n type semiconductors are arranged in a checkerboard pattern and electrical jumpers are soldered, each to two different semiconductors, at the cold side and at the hot side so as to place all of the semiconductor elements in series with each other. This method is a low cost method and well established but has some limitations. Above 100° C. the solders will defuse into the thermoelectric elements destroying them. In a high humidity atmosphere moisture may condense in the spaces between the elements and thermally short the module. The structure is not mechanically strong and easily fractures.

Another currently used method is the so-called eggcrate design shown in FIG. 21. Here an "eggcrate" made of insulator material separates the thermoelectric elements and permits electrical jumpers to be pressed against the elements to provide a good electrical connection without solder. It is also known to spray a conductor material on each side of these eggcrates to provide electrical connections. In prior art designs, the eggcrates are fabricated from individual strips which have been cut to shape having a series of slots using a precision laser cutter. The strips are then assembled into an eggcrate by interlocking the laser machined slots. All of the elements can be connected in series by proper construction of the eggcrate. Obviously it is possible in both devices to arrange for any desired number of elements to be in series. Thus, several elements in series may form a series set and this set could be arranged in parallel with other similar sets. The major disadvantage of prior art eggcrates is illustrated in FIG. 21. As is apparent in FIG. 21, gaps at junctions formed by the intersecting strips can permit electrical shorts between adjacent cells to occur, especially if electrical jumpers are applied using techniques such as metal spraying. Such shorts obviously could substantially degrade performance, reducing the power output of the module.

Also, prior art eggcrate modules are expensive due primarily to the fact that labor costs to assemble the eggcrates and to install the elements in the crates is expensive. What is needed is a gapless, lower cost thermoelectric eggcrate module.

SUMMARY OF THE INVENTION

The present invention provides a thermoelectric module having a gapless insulating eggcrate providing insulated spaces for a large number of p-type and n-type thermoelectric elements. The absence of gaps in the walls of the spaces virtually eliminates the possibility of interwall shorts between the elements. Electrical connections on both the hot and cold sides of the module electrically connect the elements in series or in parallel as desired. Usually, most or all of the elements will be connected in series. In a preferred embodiment, the gapless eggcrate is formed from a high temperature plastic. In a preferred embodiment, two lead wires are added before adding the hot and cold side electrical connections. In this embodiment, electrical connections on the hot and cold sides comprise a thin layer of molybdenum and a coating of aluminum over the molybdenum. The surfaces are ground down to expose the insulating eggcrate walls except where connections between the elements are desired. In this preferred embodiment a seal is then applied over both the hot and cold surfaces. The seal preferably is comprised of a very thin electrically insulating layer and over this electrically insulating layer a thin metal layer is provided.

BRIEF DESCRIPTION OF THE DRAWINGS

FIG. 19 shows our metallizing process.

DETAILED DESCRIPTION OF PREFERRED EMBODIMENTS

A preferred embodiment of the present invention can be fabricated as set forth below:

FABRICATING THE EGGCRATE

Injection Molded Eggcrate

Figures 15A, 15B, 16A, 16B:
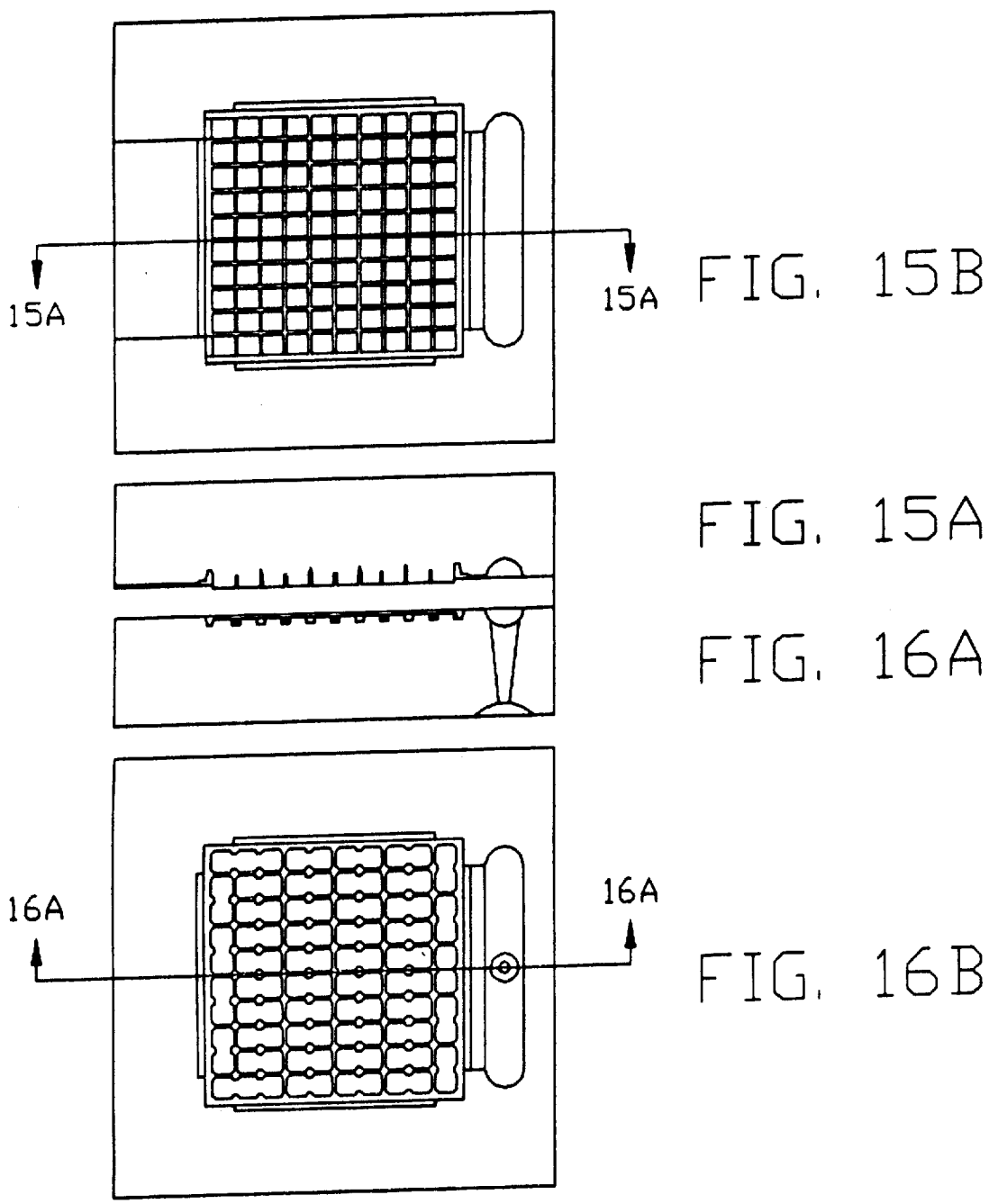
FIGS. 15A and B and 16 A and B show a mold for making the eggcrate.
Figure 17:
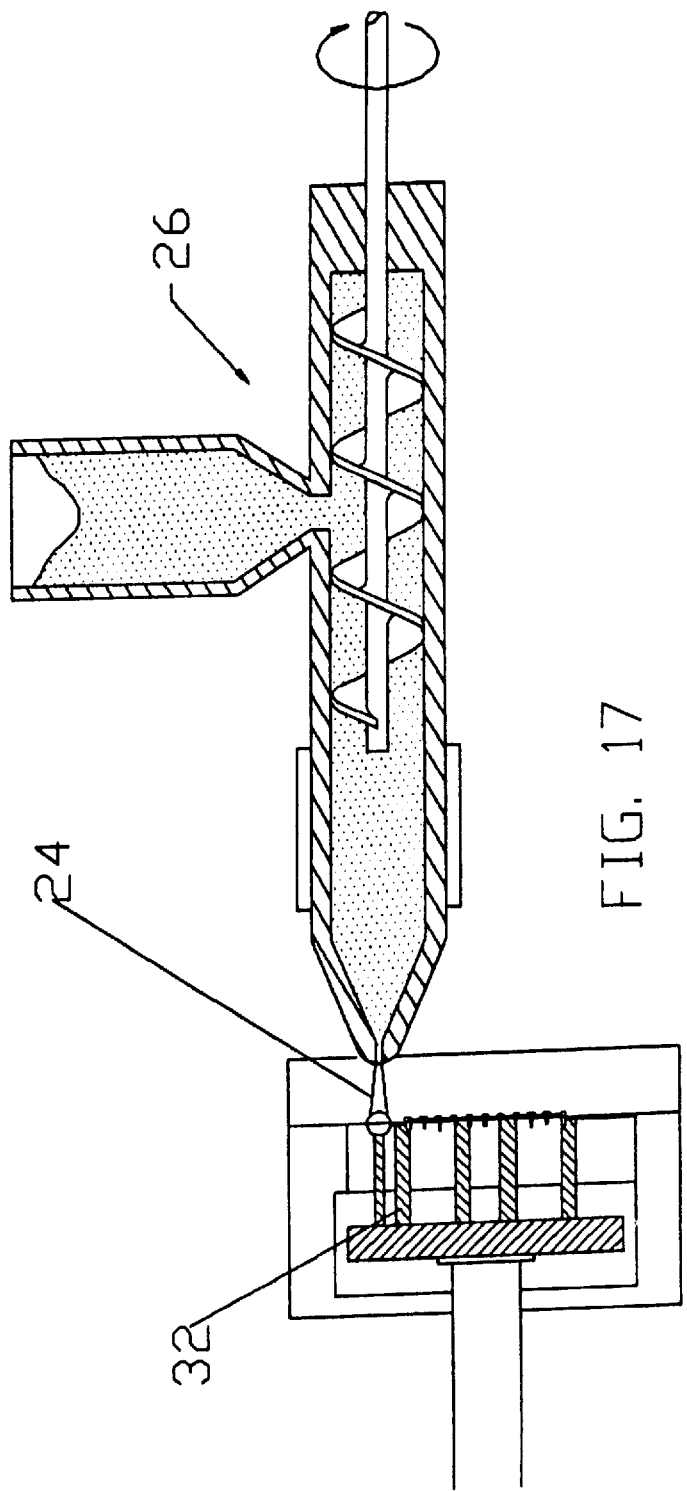
FIG. 17 shows our injection molding process.
Figure 18:
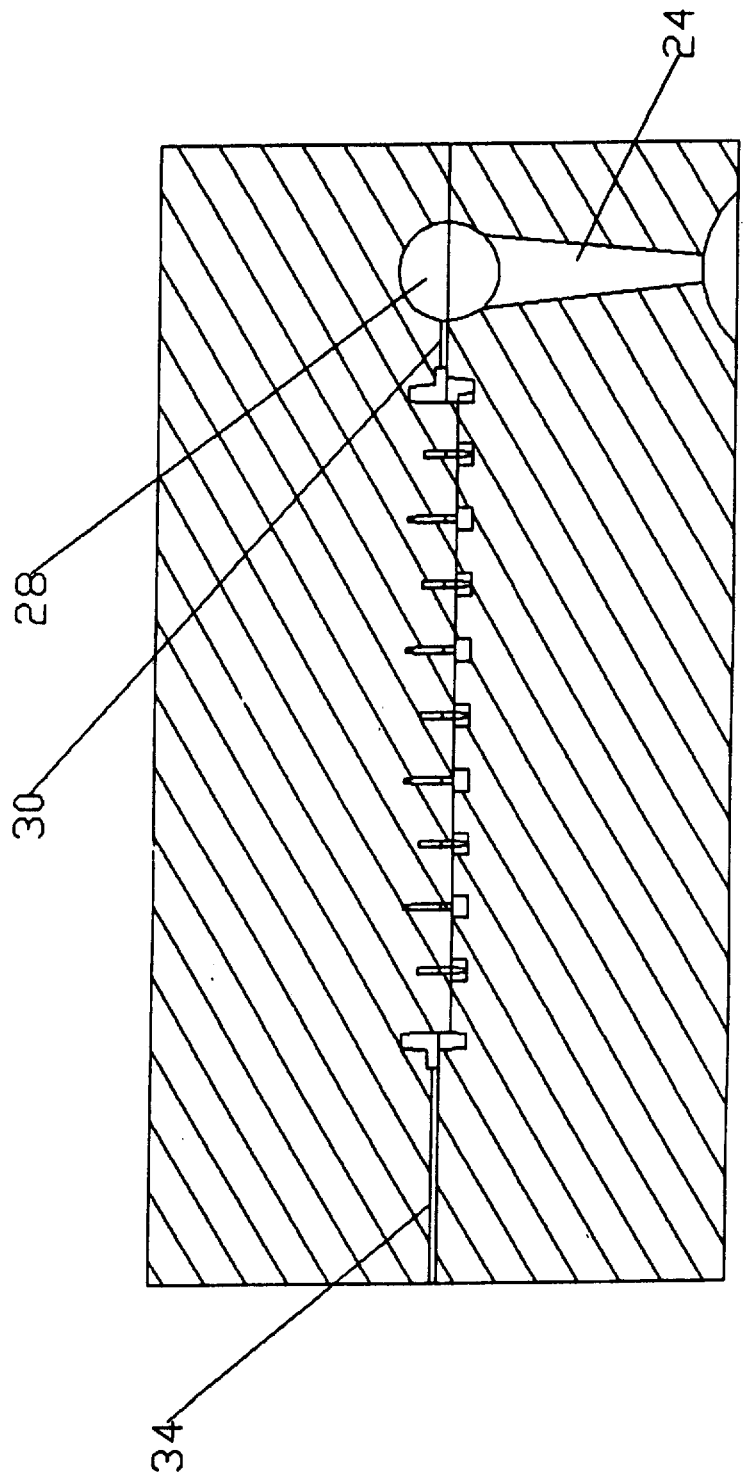
FIG. 18 shows the mold fitted together.
Figure 20:
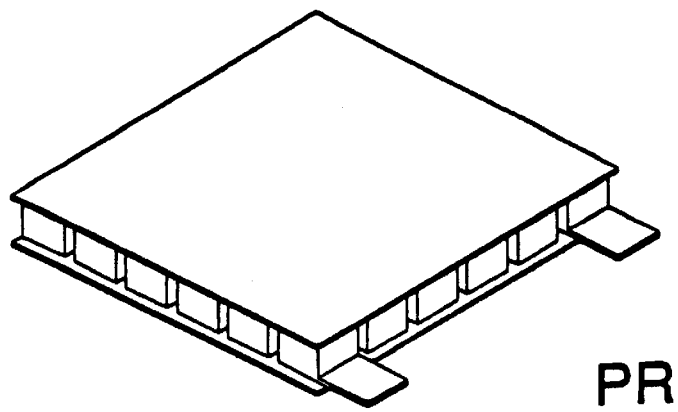
FIG. 20 shows a prior art thermoelectric device.
Figure 21:
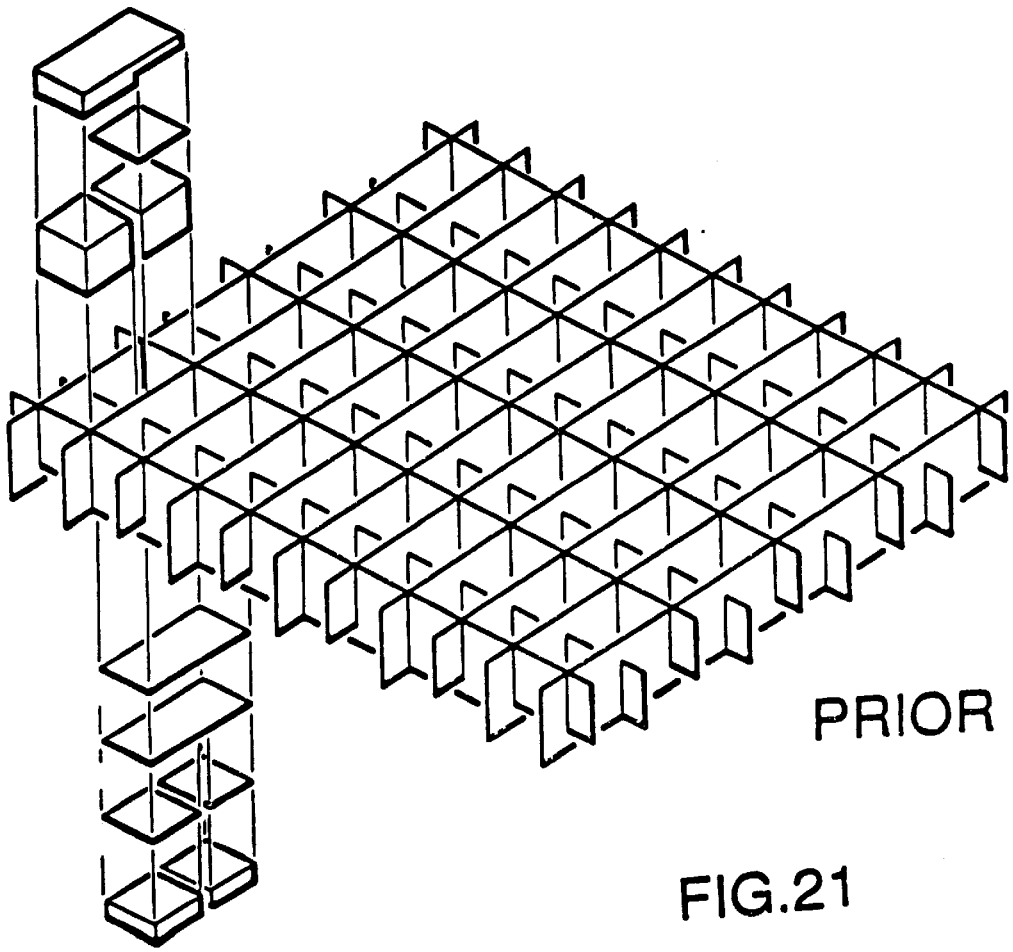
FIG. 21 shows details of a prior art eggcrate device.

The eggcrate for this preferred embodiment is injection molded using the mold pattern shown in FIGS. 15A and B and 16A and B. FIGS. 15A and B show the bottom 20 of the mold pattern and FIGS. 16A and B show the top 22 of the pattern. The top and bottom are shown in their molding position in FIG. 18. A high temperature thermo plastic, such as the liquid crystal polymer resin, Dupont Zenite, is injected through sprue 24 using well known plastic molding techniques in an injection molding machine 26 such as the one depicted in FIG. 17. With the Dupont Zenite plastic the dryer is maintained at 275° F. and the barrel temperatures range from 625° F. at the rear to 640° F. near the nozzle. Both the bottom mold and the top mold are maintained at a temperature of about 200° F. Zenite melts at about 550° F. In the usual manner the fluid plastic passes through sprue 24, runner 28, and gate 30 into the mold cavity. The vent is shown at 34 in FIG. 18. The finished part is ejected by injection pins 32 as shown in FIG. 17. Initial production runs made by applicants supplier have produced excellent eggcrates at a rate of about 50 eggcrates per hour. This rate can easily be increased to 200 eggcrates per hour for one worker and ultimately the process can be completely automated. This compares to a one worker production rate of about 3 eggcrates per hour with the prior art method of assembling thermoelectric module eggcrates from appropriately slotted layers of insulating materials.

Figure 1A:
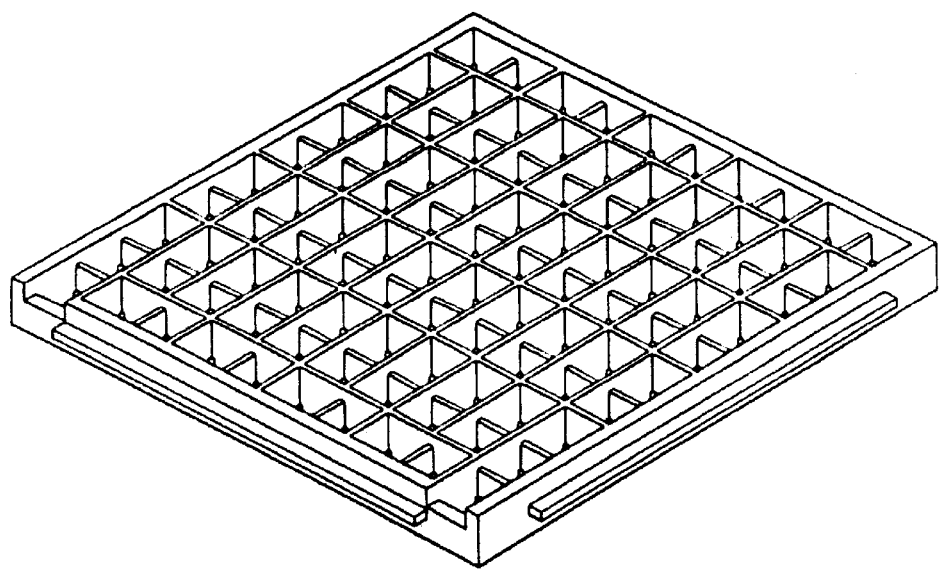
FIGS. 1A and B are two views of an eggcrate according to the present invention.
Figure 1B:
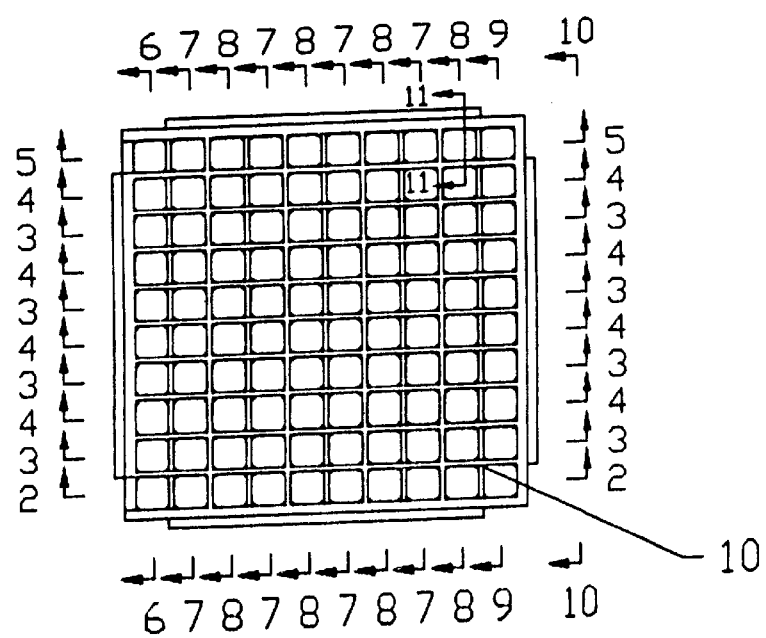
Figure 5:
FIGS. 2 through 9 and 11 are section views of the above eggcrate.
Figure 4:
Figure 3:
Figure 2:
Figure 6:
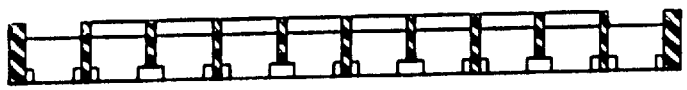
Figure 7:
Figure 8:
Figure 9:
Figure 10:
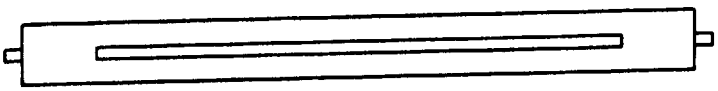
FIG. 10 show an end view.
Figure 11:
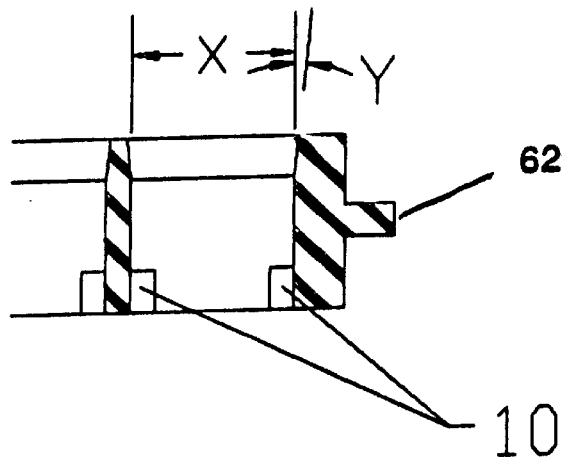
Figure 12:
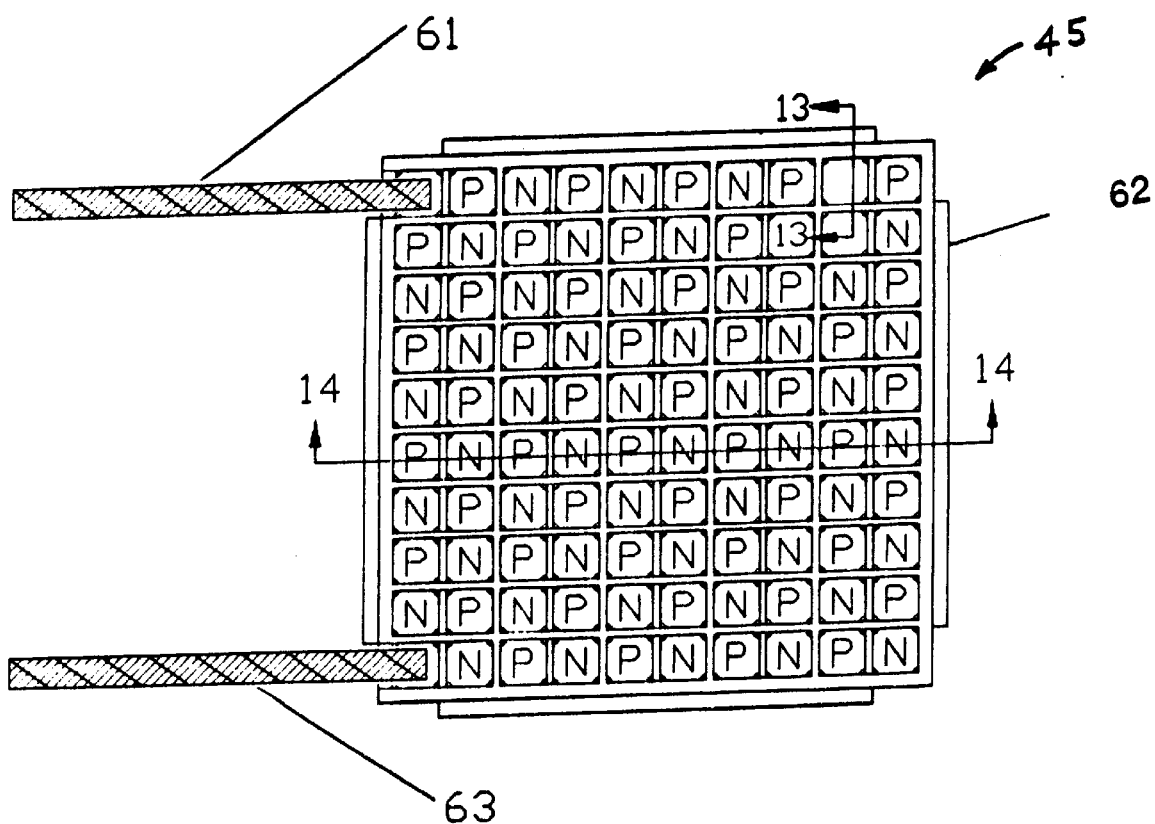
FIGS. 12 and 14 show a preferred element arrangement.

The completed injection molded eggcrate is shown in FIG. 1A. This embodiment contains boxes (spaces) for 100 thermoelectric elements. In a preferred embodiment two of the corner spaces are eliminated to make a stronger base for electrical leads. The dimension of the elements are 5.1 mm×5.1mm×3.0 mm. The dimension of the spaces at the bottom of the eggcrate are 5.1 mm×5.1 mm. A top view of the eggcrate is shown in FIG. 1. FIGS. 2 through 9 show various section through the eggcrate. FIG. 10 is a side view and FIG. 11 is a sectional view which shows an expanded view of one of the boxes created by the eggcrate. Note that the upper part of the walls of the box is tapered 5 degrees as shown at Y in FIG. 11. In this embodiment the straight part of the walls of the box forms a 0.2 inch square as shown at X in FIG. 11. This dimension is held to a tolerance of plus 0.001 inch to provide a tight fit for thermoelectric elements which are 0.200 inch square with a tolerance of minus 0.001. Note that a support ridge 62 as shown in FIGS. 11 and 12 is provided around the boundary of the eggcrate at the midplane between the two surface planes of the eggcrate. This support ridge provides extra strength for the eggcrate and is utilized during subsequent stages of module fabrication and can be useful in mounting the completed module for use.

Figure 13:
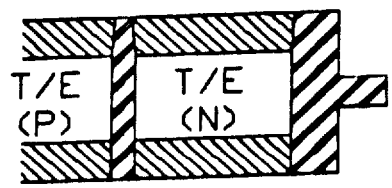
FIG. 13 shows an enlarged view of a portion of a cross section of a module showing parts of the eggcrate the elements and metal coatings.
Figure 14:

FIG. 12 shows a top view of the eggcrate with the locations indicated for the P and N elements. The elements are placed in these locations with the installer assuring that each element rest firmly against stops 10 as shown in FIGS. 1 and 11. Conductor material is then sprayed on the top and bottom of the eggcrate and then the tops and bottoms are ground down until the tops of all insulator surfaces are cleared of conductor material. A preferred procedure for loading the eggcrate is discussed in detail below. FIGS. 13 and 14 show examples of sections of the finished product at location 13—13 and 14—14 as shown in FIG. 12. Note in FIG. 14 how the effect is to connect all the thermoelectric elements in series electrically. In this particular section the hot surface is on the top and the electron flow is from left to right.

INSTALLATION OF THERMOELECTRIC ELEMENTS

Thermoelectric Elements

Thermoelectric elements with dimensions of 5.1 mm×5.1 mm×3.0 mm are prepared using any of several well known techniques such as those described in Thermoelectric Materials edited by Sittig, published in 1970 by Noyes Data Corporation, Park Ridge, N.J. Preferred materials are Lead Telluride for high temperature applications and Bismuth Telluride for low temperature applications. These elements may also be purchased commercially from suppliers such as Melcor Corporation with offices in Trenton, N.J. One half of the elements should be "n" elements and one half "p" elements.

Loading the Eggcrates

Position "p" elements in the appropriate boxes of the eggcrate as shown in FIG. 12. Ensure that the element is snug against the stop. Position "n" elements in the appropriate boxes of the eggcrate as shown in FIG. 12. Ensure that each element is snug against the stop. Insert a 2 inch long ⅛ inch wide copper mesh wire lead at positions 61 and 63 as shown in FIG. 12. Alternatively, the corner positions where the leads are attached could be modified so that instead of a space at these two positions, the space is solid eggcrate material, and is molded with these two positions filled with solid plastic. Thus, no corner element is present in the position where the copper lead connection is made. So in this embodiment the P position where lead 61 attaches is solid plastic (about 0.5 cubic centimeter) and the N position where lead 63 attaches is solid plastic (about 0.5 cubic centimeter). This improves the ability to automate the welding of the copper lead to the eggcrate. On the hot side of the module this plastic extends to the full height of the eggcrate walls but on the cold side the plastic only extends to the same height as the adjacent element. The copper lead (item 61 & 63 of FIG. 12) is positioned over the plastic where the element would normally have been placed and using a parallel gap spot welder the copper lead is heated to the point where the plastic begins to soften and the lead is pressed into the softened plastic. Having the solid plastic corner to bond the copper lead to is an important advantage since it prevents the corner element from heating excessively and melting the "stops"(item 10 of FIG. 1 and FIG. 11). When the stops melt, the compressive force from the parallel gap welder can move the corner element out of position thereby compromising the module integrity. Since the difficult weld made to the corner elements required tight specifications the process would be difficult to automate. Welding the leads into plastic is simple and tolerant of varying welding parameters. Other problems that are eliminated are cracked corner legs and weak welds caused by the difficulty of welding copper leads to corner elements.

PROVIDING ELECTRICAL CONNECTIONS FOR THERMOELECTRIC ELEMENTS

Metallizing the Hot and Cold Surfaces

Using spring loaded clamps, we clamp a number of modules to a rotatable mandrel. In FIGS. 19A and B we show 20 modules clamped to such a mandrel. We then grit blast the module/element surface with 180–240 grit $Al_2O_3$ to a uniform matte finish with the mandrel rotating at 55 rpm. Then we use compressed air to blow the module/element surface clean. Next we apply a metal thermal spray coating to the exposed surface using a thermal spray coating system as shown in FIGS. 19A and B. These spray techniques are well known. Further specific details are provided in Metals Handbook, Ninth Edition, published by the American Society for Metals. A variety of metals can be used to coat the surface. Our preferred coating is a two-layer coating comprising a first 0.006 inch thick coating of molybdenum and a second 0.06 inch thick coating of aluminum. The molybdenum is deposited so the surface is coated as quick as possible to minimize oxidation of the thermoelectric surfaces. To accomplish this essential bond coating the gun is held very close to the work piece, approximately 4 inches. This distance is much less than what is typically used in the thermal spray industry for molybdenum. The molybdenum coating is built up to 0.006 inches "in" approximately 0.0005" increments using typical molybdenum spray parameters for arc-wire guns. Using a Metco 5RG arc wire system with 14 gauge molybdenum, the atomizing air pressure is 80 psi±5 psi, operating voltage is 32 VDC and the operating amperage is 175 amps±10 amps. The wire clamps use pressure of 50 psi. The aluminum is intentionally deposited so it is not fully dense and strong. If the coating is too strong it will cause significant stresses to develop near the molybdenum-thermoelectric material interface that can cause cracks or failure in the thermoelectric materials. The aluminum is deposited with the gun approximately 17"from the work piece. This distance is much more that what is typically used in the thermal spray industry for aluminum. For a 14 gauge aluminum wire the atomizing air pressure is 50 psi±5 psi, the operating voltage is 29 VDC and the operating current is 150±10 amps. The wire clamps use air pressure of 45 psi. In this manner the aluminum deposited is sufficiently conductive to act as a good electrical conductor. The above parameters were developed for the thermoelectric elements that are approximately 0.200"×0.200"in cross section. As the cross-sectional dimensions are reduced it is possible to relax the spray parameters since the thermal stresses developed near the molybdenum-aluminum interface are less, and therefore less susceptible to cracking. Both coatings are applied using the system shown in FIGS. 19A and B with the mandrel rotating at 55 rpm and the spray gun running back and forth at speeds of about 0.2 inch per second. After the surfaces are coated we remount the modules to expose the unsprayed surface and repeat the above described process.

Reducing the Module Surfaces

The sprayed surfaces must be reduced down to expose the eggcrate walls. To do this we position a sprayed module in the mounting chuck of a surface finishing or lapping machine. Our preferred finishing methods utilize either precision sanding or double side lapping, or both. We reduce the surface of the module to the appropriate height as measured from eggcrate tab 62 shown in FIGS. 11 and 12. We then remove the module from the chuck, reverse the module and reduce the opposite face of the module until the module surface is the appropriate height from the eggcrate tab.

APPLYING INSULATING SEAL

Figure 22:
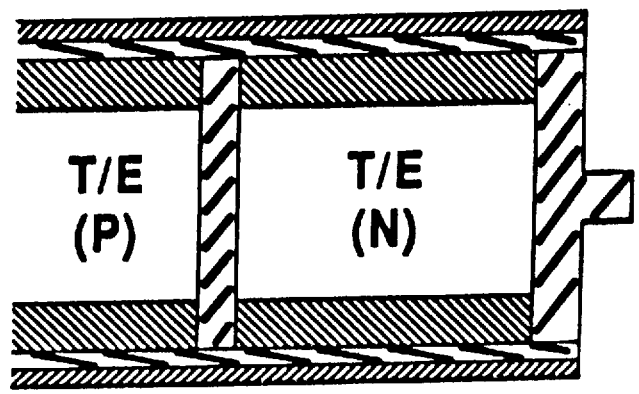
FIG. 22 shows the thermoelectric module covered by seals comprising insulating and conductive layers.

At this point the module is complete but is susceptible to moisture accumulation in the spaces between the element and the eggcrate wall. This moisture is a thermal short and can cause corrosion over time. The module can be sealed by bonding a thin layer of aluminum sheet to each face using a polyimide film made by DuPont. The film is known by the trade name Kapton and a suitable film type is 100 KJ. When heated under pressure this film will bond to the surface to which it is in contact. By positioning a piece of this Kapton film between the surface of the module and a thin sheet of aluminum the aluminum is tightly bonded to the module but is not in electrical contact to the module since it is isolated by the Kapton film. The Kapton-aluminum seal is shown in FIG. 22 with the thickness of both layers being exaggerated. This constitutes the preferred embodiment but the aluminum sheet could be replaced with copper sheet or any other metal, ceramic, glass or plastic sheet. The self adhesive Kapton film could also be replaced with similar films or coatings that are used with or without adhesive. It is also possible to use an insulator film and a conductor film without having them bonded.

This process of sealing the faces of the modules has the additional advantages of greatly reinforcing the elements of the modules. It also makes the surface of the module electrically isolated from the electrical circuit of the module. This eliminates the need (and associated cost) for isolating the module electrically from the heat source or heat sink when installing the module in a thermoelectric generator or in a cooling system.

INSPECTION

We heat the hot surface of the module to 250° C. and cool the cold side of the module to 50° C. We then measure the open circuit voltage of the module. It should be about 3.2 volts with bismuth telluride elements. We then apply an electrical load to the module until the voltage drops to 1.6 volts and measure the current. We calculate the power produced by the module as P=I X V. We expect a power level of at least 13 watts for the bismuth telluride elements.

The foregoing description of the present invention has been presented for the purpose of illustration and is not intended to limit the invention to the precise form disclosed. It is understood that many modifications and changes may be effected by those skilled in the art. For example, other materials besides Zenite can be used for injection molded eggcrates. These include Xydar (manufactured by Amaco which is substantially equivalent to Zenite), polyethylene, silicones, teflons, and many others. Zenite was primarily selected because of its superior properties (i.e., melting point, thermal stability, etc.) at higher temperatures. Also it should be possible to use a ceramic material in the form of a "slip". (This is the term used for describing a fine ceramic material suspended in a liquid.) After molding, the liquid is removed by drying and /or the mold (typically plaster of paris) absorbing the liquid. The components are then sintered to give them strength. Zenite, in fact, contains a fine glass powder filler to reduce material costs and control other material properties. This filler could be some other material such as carbon or come chopped fibers made from fiber glass, graphite fibers, etc. Other moldable materials which could be used are organic precursors that transform from the organic to the inorganic state when heated or inorganic materials themselves. Materials of this nature would be very desirable for higher temperature eggcrates that would be used with high temperature thermoelectric materials such as PbTe and SiGe which operate at temperatures greater than 350° C. which is typically an upper limit on most organic materials. These materials would allow the eggcrate to be loaded to higher values at temperatures where organic materials typically lose their strength. Phosphate and silicate pastes and cements might also be used for the eggcrate material for high temperature applications.

Other methods for fabricating the gapless eggcrate may be used instead of the described injection molding method. These methods include:

Casting

Several methods of casting would be suitable for the fabrications of eggcrates. Two part epoxies of resins could be poured into a mold similar to the mold described and cured to form the eggcrate. By using castings the elements could be included in the mold as inserts and cast in place. Other materials that could be cast are plastics, glass, ceramics and metal alloys.

Slip Casting

Another method of casting materials is slip casting. This is a forming process in which a mold, usually made of plaster of paris, draws water out of the slip. This leaves a deposit behind that conforms to the die (which would replicate the eggcrate structure) walls. The deposit is then dried and fired into a rigid structured. The "slip" is made up of a fine powder of the component to be made and it is suspended in water. The powder can be an organic or inorganic material.

Blow Molding

Plastic film is inserted within a mold and blown to conform to the shape of the mold with pressured air.

Extrusion Techniques

When an eggcrate is sectioned in planes parallel to the hot and cold surfaces of the module, three different profiles are possible. These three profiles can be extruded. Near the hot side the profile of the section would define the positions of the hot side connectors. Near the center of the eggcrate the profile would define the positions of the elements and near the cold side of the eggcrate the profile will define the position of the cold side elements. Each of the profiles could be formed by extruding plastic, glass or ceramic (in the green or unfired state) through an extrusion die. The extrusions would then be sliced to the appropriate thickness and laminated together to form the completed gapless eggcrate. It is also possible that a single extrusion profile could be sliced into the appropriate thickness and then subsequently formed using various techniques into the desired shape on the ends (to create stops and to accommodated the electrodes). Ceramic extrusions would be fired after the forming operation.

Vacuum Forming

Thin plastic sheets are formed over heated molds to take on the desired shape. The plastic is force over the mold with a vacuum or in some cases with pressurized air to provide a gapless eggcrate.

Conventional Machining

The gapless eggcrate can be formed by machining the spaces for the elements in a block of plastic material. Even some machinable ceramic materials could be drilled, shaped milled etc. to form the desired eggcrate structure. Ultrasonic machining, laser machining and water jet machining techniques could also be used to form a gapless eggcrate from a block of plastic or ceramic material.

Stamping

The gapless eggcrate can be formed by designing a tool that would punch the required size of square holes in sheet of material. The stops at the bottom of the holes could then be formed in a second operation that would transpose some of the material from to frame so it acted as a stop.

Die Casting

The material to be formed (plastic, glass, ceramic slurry or metal) is poured into a mold cavity to form the desired shape of a gapless eggcrate.

Powder Pressing

Metal, plastic, ceramic or glass powders are pressed into a die with sufficient force to take on the shape of the punch and die combination (the shape of the gapless eggcrate). The green part is then ejected and can subsequently be fired to increase strength.

Forging

The material to be formed is repeatedly hammered between two halves of a mold until the desired shape of the mold (the gapless eggcrate) is imparted to the piece being formed.

Accordingly it is intended by the appended claims to cover all modifications and changes as fall within the true spirit and scope of the invention.

We claim:

1. A thermoelectric module defining a cold surface and a hot surface comprising:
   a) a molded single piece gapless crate having the form of an eggcrate defining a plurality of thermoelectric element spaces,
   b) a plurality of p-type thermoelectric elements,
   c) a plurality of n-type thermoelectric elements, said p-type and said n-type thermoelectric elements being positioned in said thermoelectric element spaces,
   d) a metallized coating on said cold surface connecting p-type thermoelectric elements to n-type thermoelectric elements on said cold surface,
   e) a metallized coating on said hot surface connecting p-type thermoelectric elements to n-type thermoelectric elements on said hot surface, the position of said p-type and said n-type elements, the configuration of said eggcrate and said metallized coatings being effective to cause a plurality of said thermoelectric elements to be connected electrically in series.

2. A thermoelectric module as in claim 1 wherein said crate is comprised of high temperature material.

3. A thermoelectric module as in claim 2 wherein said high temperature material is a liquid crystal plastic.

4. A thermoelectric module as in claim 3 wherein said high temperature liquid crystal plastic is Dupont Zenite.

5. A thermoelectric module as in claim 2 wherein said high temperature material is a silicone plastic.

6. A thermoelectric module as in claim 2, wherein said high temperature material is an inorganic with an organic plastizer.

7. A thermoelectric module as in claim 1 wherein each of said plurality of thermoelectric element spaces defines four walls and a substantially square space for a thermoelectric element having a square face.

8. A thermoelectric module as in claim 7 wherein at least two of said walls define upper wall sections which are tapered to permit easy installation of said thermoelectric elements.

9. A thermoelectric module as in claim 7 wherein each of said plurality of thermoelectric spaces define four intersections at the intersections of said walls and further comprising a stop means at least three of said intersections for limiting the depth of insertion of said thermoelectric elements.

10. A thermoelectric module as in claim 1 said hot and cold surfaces each defining a surface plane and a surface boundary and further comprising at least one molded support ridge which is outside said surface boundary and between said surface planes.

11. A thermoelectric module as in claim 1 and further comprising two electrical leads.

12. A thermoelectric element as in claim 1 wherein said metallized coatings comprise a layer of molybdenum and a layer of aluminum.

13. A thermoelectric element as in claim 1 wherein said metallized coatings comprise a layer of a nickel-aluminum alloy.

14. A thermoelectric module as in claim 1 and further comprising two electrical leads attached to said module, one of said leads being welded to said eggcrate so as to contact with a "p" type element and the other of said leads being welded to said eggcrate so as to contact with a "n" type element.

15. A thermoelectric module as in claim 1 wherein both hot and cold surfaces are covered with an electrically insulating film.

16. A thermoelectric module as in claim 15 wherein said electrically insulating film is covered with a metal layer.

17. A process as in claim 15, wherein said electrically insulating film is comprised of an adhesive film.

18. A thermoelectric module as in claim 17 wherein, said film is Kapton, a polyamide film made by Dupont.

19. A thermoelectric module defining a cold surface and a hot surface comprising:
   a) a molded single-piece gapless crate, comprised of an electrically insulating ceramic material, having the form of an eggcrate defining a plurality of thermoelectric element spaces,
   b) a plurality of p-type thermoelectric elements,
   c) a plurality of n-type thermoelectric elements, said p-type and said n-type thermoelectric elements being positioned in said thermoelectric element spaces,
   d) a metallized coating on said cold surface connecting p-type thermoelectric elements to n-type thermoelectric elements on said cold surface,
   e) a metallized coating on said hot surface connecting p-type thermoelectric elements to n-type thermoelectric elements on said hot surface, the position of said p-type and said n-type elements, the configuration of said eggcrate and said metallized coatings being effective to cause a plurality of said thermoelectric elements to be connected electrically in series.

20. A thermoelectric module as in claim 19 wherein at least two of said walls define upper wall sections which are tapered to permit easy installation of said thermoelectric elements.

21. A thermoelectric module as in claim 19 wherein each of said plurality of thermoelectric spaces define four intersections at the intersections of said walls and further comprising a stop means at at least three of said intersections for limiting the depth of insertion of said thermoelectric elements.

22. A thermoelectric module as in claim 19 wherein said hot and cold surfaces each define a surface plane and a surface boundary and further comprising at least one molded support ridge which is located outside said surface boundary and between said surface planes.

* * * * *